(12) United States Patent
Andresakis et al.

(10) Patent No.: US 7,862,900 B2
(45) Date of Patent: *Jan. 4, 2011

(54) MULTILAYERED CONSTRUCTION FOR USE IN RESISTORS AND CAPACITORS

(75) Inventors: John A. Andresakis, Clifton Park, NY (US); Pranabes K. Pramanik, Clifton Park, NY (US)

(73) Assignee: Oak-Mitsui Inc., Hoosick Falls, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/547,881

(22) Filed: Aug. 26, 2009

(65) Prior Publication Data

US 2009/0314531 A1    Dec. 24, 2009

(51) Int. Cl.
*H01G 4/08* (2006.01)

(52) U.S. Cl. ........................ 428/626; 361/323; 361/305; 361/301.4; 428/663; 156/151; 205/183; 29/25.03; 29/25.42

(58) Field of Classification Search ..... 29/25.35–25.42, 29/830–831, 846–847, 592.1; 361/301.4, 361/303–305, 311–313, 323; 156/151; 205/183; 428/208–210, 626, 663

See application file for complete search history.

(56) References Cited

U.S. PATENT DOCUMENTS

| | | | |
|---|---|---|---|
| 3,808,576 A * | 4/1974 | Castonguay et al. | 338/309 |
| 4,808,967 A | 2/1989 | Rice et al. | 338/309 |
| 4,888,574 A | 12/1989 | Rice et al. | 338/309 |
| 4,892,776 A | 1/1990 | Rice | 428/209 |
| 5,185,689 A * | 2/1993 | Maniar | 361/313 |
| 5,261,153 A * | 11/1993 | Lucas | 29/830 |
| 5,336,391 A | 8/1994 | Rice | 205/152 |
| 5,689,227 A | 11/1997 | Nguyen et al. | 338/308 |
| 5,689,879 A * | 11/1997 | Urasaki et al. | 29/846 |
| 5,945,257 A * | 8/1999 | Doeling | 430/313 |
| 6,215,649 B1 | 4/2001 | Appelt et al. | 361/312 |
| 6,281,090 B1 * | 8/2001 | Kukanskis et al. | 438/382 |
| 6,356,455 B1 | 3/2002 | Carpenter | 361/793 |
| 6,657,849 B1 | 12/2003 | Andresakis et al. | 361/311 |
| 6,693,793 B2 * | 2/2004 | Kuwako et al. | 361/323 |
| 6,759,596 B1 * | 7/2004 | Shelnut et al. | 174/255 |
| 6,870,436 B2 | 3/2005 | Grebenkemper | 333/12 |
| 6,873,219 B2 | 3/2005 | Grebenkemper | 333/12 |
| 7,192,654 B2 * | 3/2007 | Andresakis et al. | 428/626 |
| 7,382,627 B2 | 6/2008 | Borland et al. | 361/763 |
| 7,430,128 B2 | 9/2008 | Borland et al. | 361/766 |
| 7,596,842 B2 * | 10/2009 | Andresakis et al. | 29/25.42 |
| 2004/0128822 A1 | 7/2004 | Tung | 29/592.1 |

* cited by examiner

*Primary Examiner*—Minh Trinh
(74) *Attorney, Agent, or Firm*—Roberts & Roberts, LLP

(57) ABSTRACT

The invention concerns multilayered constructions useful in forming capacitors and resistors, which may be used in the manufacture of printed circuit boards and microelectronic devices. A thermosetting polymer layer or layers are attached directly onto a heat resistant film layer, specifically on the side(s) of the heat resistant film to be attached to an electrically conductive layer having an electrical resistance material layer thereon. Attaching the adhesive to the heat resistant film rather than the electrically conductive layer streamlines the manufacturing process, particularly in the formation of the electrical resistance material layer onto the electrically conductive layer. This also results in better precision and uniformity of the multilayered construction.

22 Claims, 3 Drawing Sheets

MULTILAYERED CONSTRUCTION FOR USE IN RESISTORS AND CAPACITORS

BACKGROUND OF THE INVENTION

1. Field of the Invention

The present invention relates to the formation of capacitors, resistors, printed circuit boards, microelectronic devices, and the like. In particular, it relates to a process for manufacturing a multilayered construction for use in preparing thin film resistor-conductor materials and the like.

2. Description of the Related Art

As the circuitry design of central processing units (CPU) seeks to achieve increased operational speed, the performance of integrated circuits becomes ever more important. The circuitry design of printed circuit boards, which mount these integrated circuits, is also very important.

Capacitors and resistors are common elements on printed circuit boards and other microelectronic devices. Capacitors are used to steady the operational power supply of such devices. A capacitor is a device used for introducing capacitance into a circuit, and functions primarily to store electrical energy, block the flow of direct current, or permit the flow of alternating current. They comprise a dielectric material sandwiched between two electrically conductive metal layers, such as copper foils. In general, the dielectric material is coupled to the electrically conductive metal layers via an adhesive layer, by lamination, or by vapor deposition.

Heretofore, capacitors arranged on the surface of printed circuit boards have been common. However, more recently, capacitors are formed of a thin, double-sided copper clad laminate within multilayered circuit board layers thus producing excellent characteristics. Of these options, it has been preferred to form printed circuit boards having embedded capacitors to maximize the surface area of the circuit board for other purposes. In order to achieve increased signal transmission speed, printed circuit board manufacturers generally form printed circuit boards within such a multilayer structure. The capacitance of a capacitor depends primarily on the shape and size of the capacitor layers and the dielectric constant of the insulating material. There are various known types of dielectric materials known in the art. For example, the dielectric material may be a gas, such as air, a vacuum, a liquid, a solid or a combination thereof. Each material has its own particular properties.

The performance of conventional capacitors for use in printed circuit boards has been limited by factors such as limited minimum thickness of their dielectric material, which detracts from the flexibility of the capacitor, the attainable capacitance, the effect of bond enhancers on the metal foils, low dielectric constant, and poor dielectric strength.

It is desirable to form a capacitor for circuit boards having a high dielectric constant and an extremely thin layer of dielectric material, thus increasing the capacitance and flexibility of the capacitor. To optimize the performance of a capacitor, it is important that the dielectric material employed have good material properties, exhibiting such qualities as superior adhesion, high dielectric strength and good flexibility. However, common problems frequently associated with extremely thin dielectric layers are the formation of microscopic voids or other structural defects and inclusion of foreign material.

These lead to electrical shorts. For example, U.S. Pat. Nos. 5,155,655 and 5,161,086 describe a method for forming a capacitor wherein a single sheet of a dielectric material is laminated together with two conductive foils. Dielectric layers of this type are highly vulnerable to the formation of voids, as well as the inclusion of foreign material, and are time consuming to detect and remedy.

U.S. Pat. No. 6,693,793 relates to a structure having a pair of conductive foils, a pair of thin dielectric layers, with one dielectric layer on a surface of each of the foils. The two conductive foils are adhered together such that the dielectric layers are attached to one another via an intermediate heat resistant film layer. This capacitor offer a significant improvement in performance over prior art capacitors and printed circuit boards. The thin dielectric layers allow for higher capacitance, greater heat conductivity and greater flexibility of the capacitor. The intermediate heat resistant film layer deters the formation of electrical shorts between the electrically conductive foils.

Conventional methods for manufacturing circuit elements include the attaching components of the structure in sequential order of the layers. However, several disadvantages result in the sequential attaching of certain layers of a structure. For example, some materials cannot be attached or formed onto other materials with desired precision and uniformity. In addition, some materials fail to provide enough strength to support other materials which must be formed thereon, or attached thereto. Furthermore, manufacturing costs associated with some materials and processes, such as electroplating, make it undesirable to attach certain layers in a sequential order.

It would be desirable to provide a method of forming a multilayered construction which has both capacitive and resistive elements, and which method also overcomes the problems associated with conventional processing steps. The present invention provides a method for forming such a multilayered structure for resistor and capacitor formation. The structure formed by this method provides high capacitance, greater heat conductivity, and greater flexibility, while also incorporating a resistor element. The inventive method also results in better precision and uniformity of such a structure and its component layers during assembly. This method further maximizes cost effectiveness in the manufacturing of such multilayered constructions.

SUMMARY OF THE INVENTION

The invention provides a method of forming a multilayered construction which comprises attaching a first thermosetting polymer layer onto a surface of a first electrically conductive layer; attaching a second thermosetting polymer layer onto a first surface of a heat resistant film; providing a second electrically conductive layer having an electrical resistance material layer formed on a surface thereof; attaching the electrical resistance material layer onto the second thermosetting polymer; and attaching the first thermosetting polymer onto a second surface of the heat resistant film layer.

The invention also provides a method of forming a multilayered construction which comprises the steps of: attaching a first thermosetting polymer layer onto a first surface of a heat resistant film; attaching a second thermosetting polymer layer onto a second surface of the heat resistant film; attaching a first electrically conductive layer onto the first thermosetting polymer; providing a second electrically conductive layer having an electrical resistance material layer formed on a surface thereof; and attaching the electrical resistance material layer onto the second thermosetting polymer.

The invention further provides a method of forming a multilayered construction which comprises the steps of: attaching a first thermosetting polymer layer onto a first surface of a heat resistant film; attaching a second thermosetting polymer layer onto a second surface of the heat resistant film; providing a first electrically conductive layer having a first electrical resistance material layer formed on a surface thereof; providing a second electrically conductive layer having a second electrical resistance material layer formed on a surface thereof; attaching the first electrical resistance material layer onto the first thermosetting polymer layer; and attaching the second electrical resistance material layer onto the second thermosetting polymer layer.

The invention still further provides a method of forming a capacitor, comprising the steps of: attaching a first thermosetting polymer layer onto a surface of a first electrically conductive layer; attaching a second thermosetting polymer layer onto a first surface of a heat resistant film; providing a second electrically conductive layer having an electrical resistance material layer formed on a surface thereof; attaching the electrical resistance material layer onto the second thermosetting polymer; and attaching the first thermosetting polymer onto a second surface of the heat resistant film layer.

DETAILED DESCRIPTION OF THE PREFERRED EMBODIMENT

Figure 1:
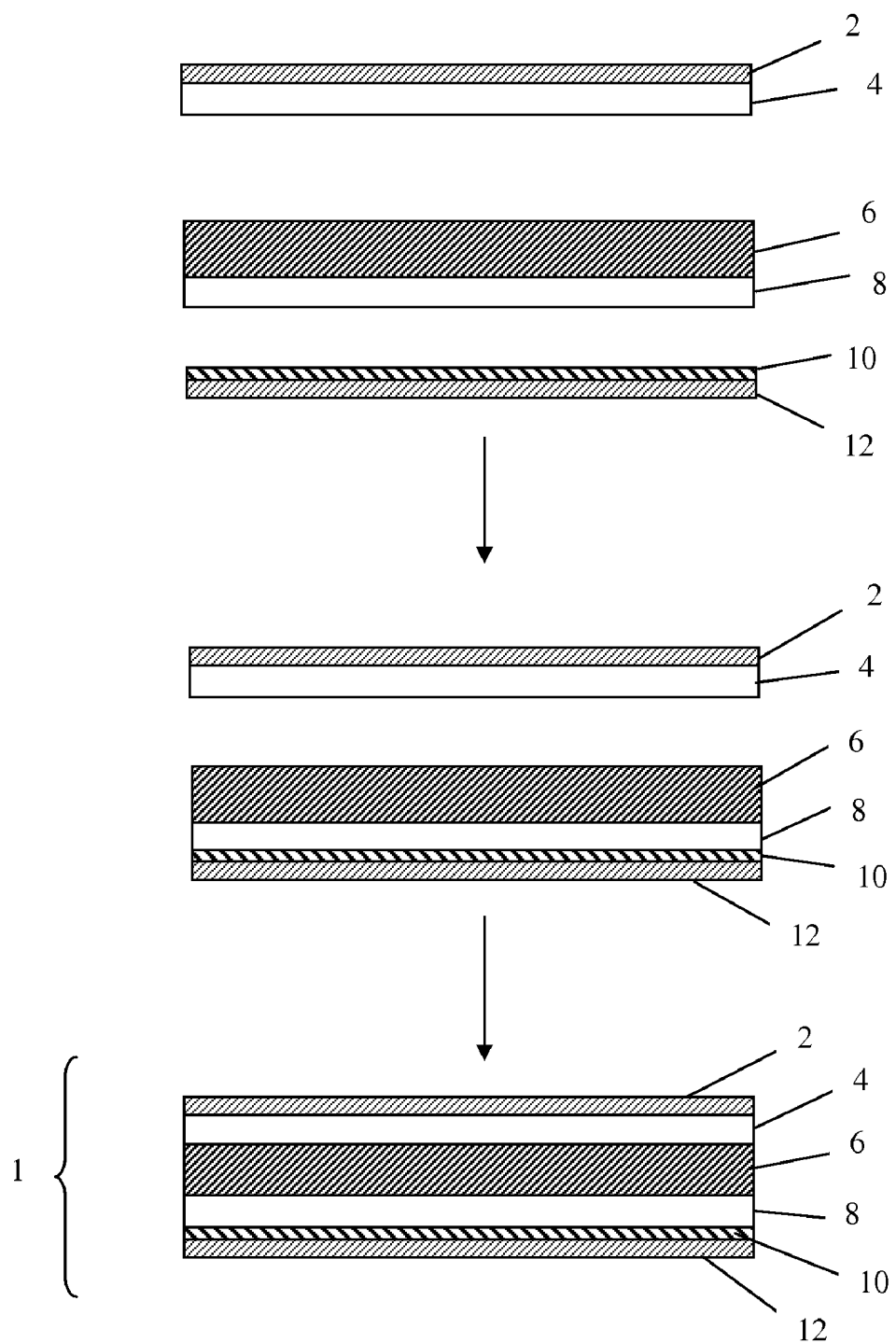
FIG. 1 is a schematic representation of a first embodiment of the inventive process, wherein the multilayered construction includes one electrical resistance material layer.

The invention relates to a method for forming multilayered constructions suitable for forming resistors, capacitors, and the like. A first embodiment of the inventive process is shown in FIG. 1. According to this process, a multilayered construction is formed by attaching a first thermosetting polymer layer 4 onto a surface of a first electrically conductive layer 2. Next, a second thermosetting polymer layer 8 is attached onto a first surface of a heat resistant film layer 6. A second electrically conductive layer 12 is then provided, which has an electrical resistance material layer 10 formed on a surface thereof. The electrical resistance material layer 10 is then attached onto the second thermosetting polymer 8; and the first thermosetting polymer 4 is attached onto a second surface of the heat resistant film layer 6.

Figure 2:
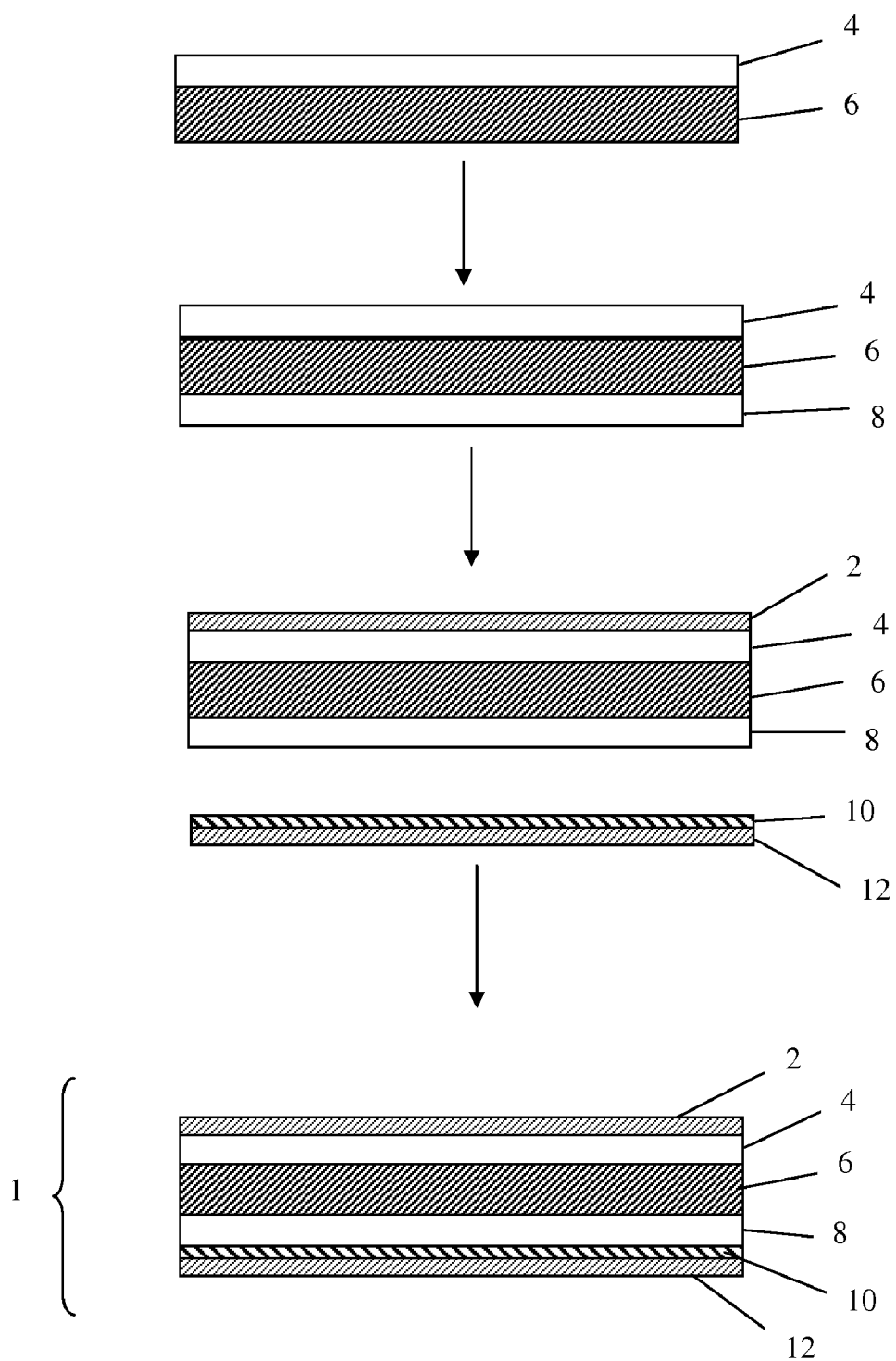
FIG. 2 is a schematic representation of an additional embodiment of the inventive process, wherein the multilayered construction includes one electrical resistance material layer.

In an alternate embodiment of the inventive process, shown by FIG. 2, a first thermosetting polymer 4 layer is attached onto a first surface of a heat resistant film layer 6, and a second thermosetting polymer layer 8 is attached onto a second surface of the heat resistant film layer 6. Next a first electrically conductive layer 2 is attached onto the first thermosetting polymer 4. A second electrically conductive layer 12 is then provided, which has an electrical resistance material layer 10 formed on a surface thereof. The electrical resistance material layer 10 is then attached onto the second thermosetting polymer 8.

Figure 3:
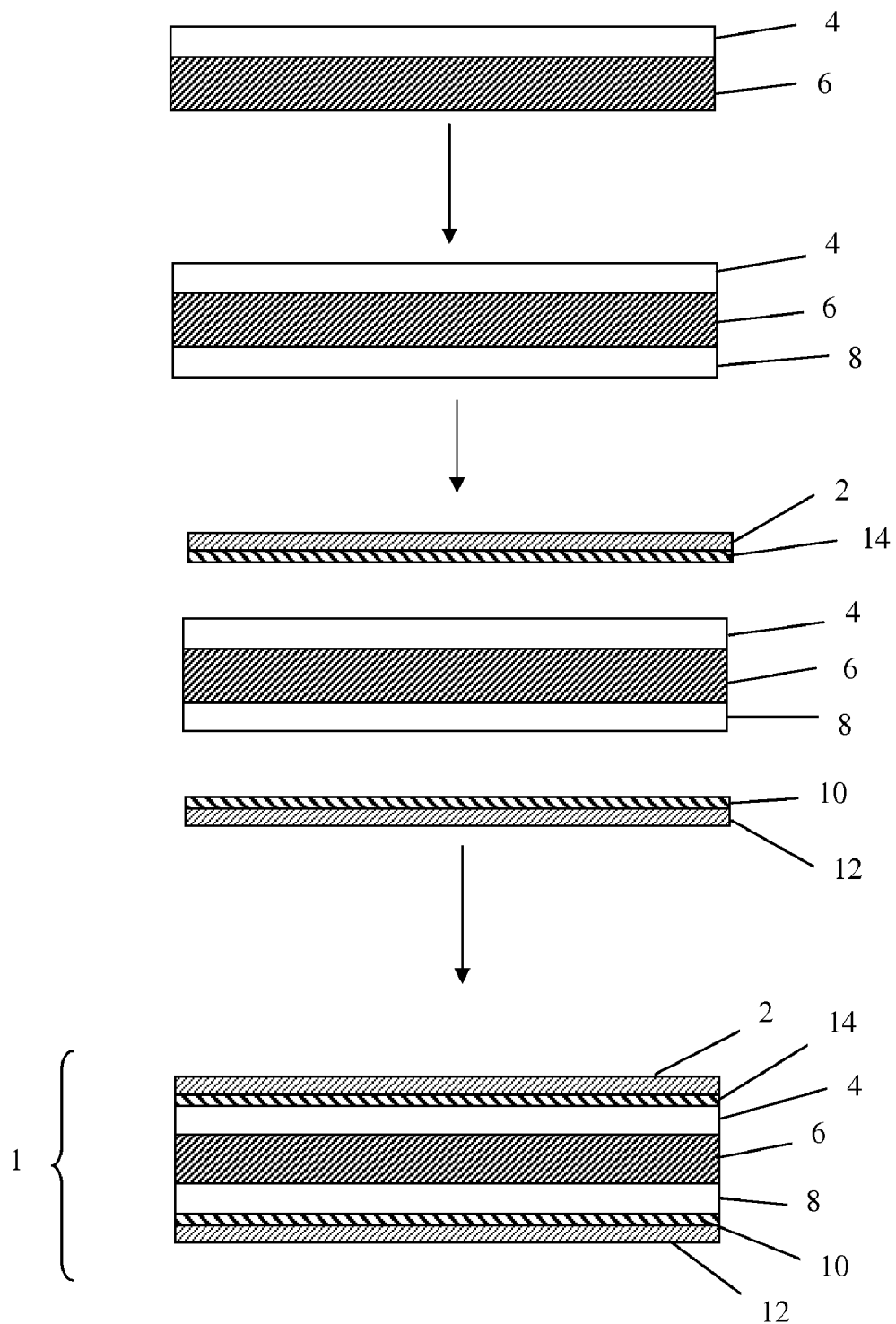
FIG. 3 is a schematic representation of an additional embodiment of the inventive process of FIG. 2, which further includes the attaching of an additional electrical resistance material layer between the first thermosetting polymer layer and the first electrically conductive layer.

In a further embodiment, show by FIG. 3, a first thermosetting polymer layer 4 is attached onto a first surface of a heat resistant film layer 6, and a second thermosetting polymer layer 8 is attached onto a second surface of the heat resistant film 6. Next a first electrically conductive layer 2 is provided, which has a first electrical resistance material layer 10 formed on a surface thereof. A second electrically conductive layer 12 is also provided, having a second electrical resistance material layer 14 formed on a surface thereof. The first electrical resistance material layer 10 is then attached onto the first thermosetting polymer layer 4, and the second electrical resistance material layer 14 is attached onto the second thermosetting polymer layer 8.

For purposes of this invention, attaching means any method of appending one layer to the next layer, non-exclusively including coating, laminating, sputtering, vapor depositing, electrodeposition, plating, or evaporating.

The order in which the layers of the multilayered constructions are attached is an important feature of the present invention. The first and second thermosetting polymer layers serve as an adhesive between the heat resistant film and the other layers of the multilayered construction. It is a key feature of this invention that the adhesive polymer layer or layers are attached directly onto the heat resistant film layer, specifically on the side(s) of the heat resistant film to be attached to an electrically conductive layer having an electrical resistance material layer thereon. Attaching the adhesive onto the heat resistant film rather than the electrically conductive layer streamlines the manufacturing process, particularly in the formation of the electrical resistance material layer onto the electrically conductive layer. This also results in better precision and uniformity of the multilayered construction.

The first electrically conductive layer 2 and the second electrically conductive layer 12 are preferably present in the form of a conductive layer or foil or the like. In a most preferred embodiment, they are each present in the form of a foil. Each electrically conductive layer may comprise either the same metal or may comprise different metals. The conductive metals appropriate for the purposes of the present invention may vary depending on the desired application. Preferably, the electrically conductive layers 2, 12 comprise a material selected from the group consisting of copper, zinc, brass, chrome, nickel, tin, aluminum, stainless steel, iron, gold, silver, titanium, platinum and combinations and alloys thereof. Most preferably, the electrically conductive layers comprise copper. The electrically conductive layers preferably have a thickness of from about 0.5 to about 200 microns, more preferably from about 9 to about 70 microns. The conductive materials used in the capacitors of this invention may be manufactured with a shiny side surface and a matte surface. Examples of such conductive materials are disclosed in U.S. Pat. No. 5,679,230, which is incorporated herein by reference.

The electrically conductive layers 2, 12 may be provided with a bond enhancing treatment on one or both sides. One or both sides of the layers may optionally be roughened, such as by micro-etching, by being electrolytically treated to form a roughened copper deposit, and/or by being electrolytically treated with a deposition of micro-nodules of a metal or metal alloy on or in the surface. Such include a treatment with nickel, chromium, chromates, zinc, and a silane coupling agent or combinations thereof. The nodules may comprise the same, or a different metal as the electrically conductive layers. The nodules are preferably copper or a copper alloy, and increase adhesion to the polymer film. Such nodules may be applied according to a technique described in U.S. Pat. No. 5,679,230, which is incorporated herein by reference. In a preferred embodiment, at least one of the first electrically conductive layer and the second electrically conductive layer are provided with a bond enhancing treatment on one or both sides thereof.

The surface microstructure of the electrically conductive layers may be measured by a profilometer, such as a Perthometer model M4P or S5P, which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062. The surface treatments are carried out to produce a surface structure having peaks and valleys which produce roughness parameters wherein the arithmetic average roughness (Ra) ranges from about 0.2 to about 1 microns and the ten point height of irregularities according to ISO 64287-1 (Rz) surface roughness may range from about 0.5 µm to about 7 µm, more preferably from about 0.5 µm to about 5 µm, and most preferably from about 0.5 µm to about 3 µm.

The first and second thermosetting polymer layers serve as an adhesive between the heat resistant film and the other layers of the multilayered construction. The first thermosetting polymer layer 4 and the second thermosetting polymer layer 8 may independently comprise an epoxy, a combination of epoxy and a material which polymerizes with an epoxy, a melamine, an unsaturated polyester, a urethane, alkyd, a bismaleimide triazine, a polyimide, an ester, an allylated polyphenylene ether (or allyl-polyphenylene ether) or combinations thereof. The thermosetting polymer layers 4, 8 are typically in dry, solid form, and may comprise about 100% of any of the above compounds, or may comprise mixtures of these compounds, or may contain other additives. Other acceptable materials include aromatic thermosetting co-polyesters such as those described in U.S. Pat. Nos. 5,439,541 and 5,707,782. Of these materials, the most preferred dielectric is an epoxy having a glass transition temperature (Tg) from about 100° C. to about 250° C., preferably from about 150° C. to about 200° C.

The thermosetting polymer layers 4, 8 may also optionally comprise a filler material. Preferred fillers non-exclusively include powdered ferroelectric materials, barium titanate ($BaTiO_3$), boron nitride, aluminum oxide, strontium titanate, barium strontium titanate, and other ceramic fillers and combinations thereof. If incorporated, a filler is preferably present in the thermosetting polymer layers in an amount of from about 5% to about 80% by volume of the layer, more preferably from about 10% to about 50% by volume of the layer. Preferably at least one of the first thermosetting polymer layer 4, the heat resistant film layer 6, and the second thermosetting polymer layer 8 comprises such a powdered filler having a dielectric constant of about 10 or higher. In addition, either one or both of the thermosetting polymer layers 4, 8 may contain a dye or pigment to impart color, alter dielectric opacity or affect contrast.

In one preferred embodiment, the thermosetting polymer layers 4, 8 are applied to the electrically conductive layers or heat resistant film layer as liquid polymer solutions to allow for control and uniformity of the polymer thickness. The solution will typically have a viscosity ranging from about 50 to about 35,000 centipoise with a preferred viscosity in the range of 100 to 27,000 centipoise. The polymer solution will include from about 10 to about 80% and preferably 15 to 60 wt % polymer with the remaining portion of the solution comprising one or more solvents. Useful solvents include acetone, methyl-ethyl ketone, N-methyl pyrrolidone, N,N dimethylformamide, N,N dimethylacetamide and mixtures thereof. A most preferred single solvent is methyl-ethyl ketone.

The thermosetting polymer layers may be also applied to the electrically conductive layers 2, 12 or heat resistant film layer 6 in the form of solid sheets. In such an embodiment, the attaching of the first and second thermosetting polymer layers to opposite surfaces of the heat resistant film layer is done by lamination. Lamination may be conducted in a press at a temperature of from about 150° C. to about 310° C., more preferably from about 160° C. to about 200° C. Lamination may be conducted for from about 30 minute to about 120 minutes, preferably from about 40 minutes to about 80 minutes. Preferably, the press is under a vacuum of at least 70 cm (28 inches) of mercury, and maintained at a pressure of about from about 3.5 $kgf/cm^2$ (50 psi) to about 28 $kgf/cm^2$ (400 psi), preferably from about 4.9 $kgf/cm^2$ (70 psi) to about 14 $kgf/cm^2$ (200 psi).

Preferably, the thermosetting polymer layers 4, 8 have a thickness of from about 2 to about 200 microns, more preferably from about 2 to about 100 microns. Preferably the thermosetting polymer layers have a dielectric strength of at least about 19,685 volts/mm (500 volts/mil) thickness.

The heat resistant film layer 6 preferably comprises a polyethylene terephthalate, a polyethylene naphthalate, a polyvinyl carbazole, a polyphenylene sulfide, an aromatic polyamide, a polyimide, a polyamide-polyimide, a polyether nitrile, a polyether-ether-ketone, or combinations thereof. It has a preferred thickness of about 12.5 µm or less. The combined thickness of the first thermosetting polymer layer 4, the heat resistant film layer 6, and the second thermosetting polymer layer 8 is about 25 µm or less.

The heat resistant film layer 6 has a VICAT softening point of about 150° C. or higher as determined by ISO 306. The heat resistant film layer 6 preferably has a Young's modulus of about 300 $kgf/mm^2$ or more, a tensile strength of about 20 $kgf/mm^2$ or more, an elongation of about 5% or more, and a higher softening temperature than the laminating temperature of the first thermosetting polymer layer 4 and the second thermosetting polymer layer 8. The dielectric constant of each of the first thermosetting polymer layer 4, the heat resistant film layer 6, and the second thermosetting polymer layer 8 is about 2.5 or more. The heat resistant film layer 6 preferably has a dielectric breakdown voltage of at least about 50 volts, more preferably at least about 250 volts, and most preferably at least about 500 volts.

Prior to attaching the layers to form the multilayered construction, the heat resistant film layer 6 may have undergone a bond enhancing treatment which may comprise a plasma treatment, a corona treatment, a chemical treatment or combinations thereof.

The electrical resistance material layer 10 preferably comprises a material selected from the group consisting of nickel, chrome, nickel-chrome, platinum, palladium, nickel-phosphorus, titanium, iridium, ruthenium, silica, and combinations thereof. In a preferred embodiment of the invention, the electrical resistance material layer comprises nickel-phosphorus.

The electrical resistance material layer 10 is preferably electroplated, using a conventional electroplating process, onto the second electrically conductive layer. Electroplating is a technique well known in the art which is typically conducted by placing a substrate in a liquid electrolyte solution, and applying an electrical potential between a conducting area on the substrate and a counter electrode in the liquid. A chemical process takes place resulting in the formation of a layer of material on the substrate.

Electroplating baths used for the deposition of resistive films typically operate at a temperature significantly greater than room temperature, that is, at a temperature in excess of 100° F. (38° C.). In fact, most baths previously used to deposit resistive alloy films operate at a temperature of 150° F. (65°

C.) to about 212° F. (100° C.). The thickness of the electro-deposited electrical resistance layer deposited on the conductive layer in known processes is a function of plating efficiency which is, in turn, a function of temperature.

An example of a suitable electro-plating bath comprises an aqueous solution of hypophosphite ions, and in particular, hypophosphite ions formed from nickel hypophosphite (Ni$(H_2PO_2)_2$). Nickel hypophosphite is easily prepared by the reaction of nickel carbonate ($NiCO_3$) with hypophosphorous acid ($H_3PO_2$). That is, nickel hypophosphite suitable for electro-deposition of a nickel-phosphorous electrical resistance layer on a conductive layer is prepared by forming an aqueous solution of about one-half mole of nickel carbonate and one mole of hypophosphorous acid with a limited amount of water thus producing a crystalline reaction product which completely dissolves when diluted with water to a concentration of about 0.67 moles per liter. The reaction is believed, without intending to limit the present invention, to proceed according to the following equation:

$$NiCO_3 + 2H_3PO_2 = Ni(H_2PO_2)_2 + CO_2 + H_2O$$

Alternatively, an electroplating bath comprising hypophosphite ions formed from nickel hypophosphite can be produced by the reaction of nickel chloride ($NiCl_2$) and sodium hypophosphite ($NaH_2PO_2$). The reaction equation is hypothesized to be:

$$NiCl_2 + 2NaH_2PO_2 = Ni(H_2PO_2)_2 + 2NaCl$$

Nonetheless, it may be preferred to employ an electroplating bath formed from nickel carbonate and hypophosphorous acid with nickel-hypophosphite as a reaction product since the reaction produces by-products of carbon dioxide and water; whereas, an electro-plating bath formed from nickel chloride and sodium hypophosphite to produce nickel hypophosphite often produces a by-product of sodium chloride which must be removed to prevent undue concentration build up over time in a continuous process. An electro-plating bath comprising hypophosphite ions formed from nickel hypophosphite has been found to be operable at temperatures from about 20° C. to 50° C. It may be desirable to operate the baths at room temperature (20° C. to 25° C.). Such baths are effectively temperature insensitive.

In one preferred embodiment, the formed electrical resistance material layer contains up to about 50 percent by weight of phosphorus. In another preferred embodiment, the electrical resistance material layer contains up to 30 percent by weight of phosphorus. In another embodiment, the electrical resistance material comprises from about 30 to about 50 percent by weight of phosphorus. A further embodiment of the invention includes an electroplating of the second electrically conductive layer in a bath comprising an aqueous solution of a nickel ion source, $H_3PO_3$ and $H_3PO_4$, wherein the bath is substantially sulfate and chloride free.

It is known in the art the resistance of the electrical resistance layer of a circuit board material is dependent on both the thickness of the electrical resistance layer and the resistivity of the material employed therein. As the thickness of the electrical resistance layer decreases, the resistance of said layer increases.

The electrical resistance material layer 10 preferably has a resistance ranging from about 0.5 ohms/square to about 10,000 ohms/square, more preferably, ranging from about 5 ohms/square to about 500 ohms/square, and most preferably ranging from about 25 ohms/square to about 250 ohms/square. The electrical resistance material layer preferably has a thickness ranging from about 0.02 μm to about 0.2 μm more preferably from about 0.03 μm to about 1 μm, and most preferably from about 0.04 μm to about 0.4 μm.

In an additional preferred embodiment, at least the top about ten atomic layers of the electrical resistance material layer are free of sulfur. In another preferred embodiment, the surface of the electrical resistance material layer is substantially pit free.

The optional additional electrical resistance material layer 14 may be the same or different from the electrical resistance material layer 10. Preferably these two layers 10, 14 are substantially the same.

In an additional embodiment of the invention (not shown), a barrier layer is adhered between said electrical resistance material layer 10 and said second electrically conductive layer 12, wherein said barrier layer has a thickness of less than about 0.1 μm, is different in composition from said electrical resistance material layer, and is capable of protecting said electrical resistance material layer 10 from attack by alkaline ammoniacal copper etchants. The barrier layer preferably has a thickness of less then about 0.1 μm, more preferably ranging from about 50 angstroms to about 0.1 μm, and most preferably from about 150 angstroms to about 600 angstroms. In a preferred embodiment, the barrier layer is electrodeposited using conventional techniques. The barrier layer can be an inorganic material which has good etchant selectivity. It is also important that the material used as the barrier layer have no substantial detrimental effect on the uniformity of the resistivity and other functional properties of the underlying electrical resistance layer. The barrier layer preferably comprises a material selected from the group consisting of Ni—Sn, Co—Sn, Cd—Sn, Cd—Ni, Ni—Cr, Ni—Au, Ni—Pd, Ni—Zn, Sn—Pb, Sn—Zn, Ni, Sn, and combinations thereof. A preferred barrier layer comprises Ni—Sn.

The multilayered constructions formed according to the inventive method are preferably used in the formation of a resistor or capacitor. Such may be used in the formation of printed circuit boards, electronic devices, and the like.

In a preferred embodiment of the invention, the preferred capacitance of a capacitor formed according to the invention is at least about 100 pF/cm$^2$, more preferably from about 100 pF/cm$^2$ to about 4,000 pF/cm$^2$. Capacitors formed according to the invention may be used in a variety of printed circuit applications. For example, an electrical connection may be present on the first electrically conductive layer and another electrical connection to the second electrically conductive layer. The capacitor may be connected to or be incorporated into a printed circuit board or other electronic device or the electronic device may comprise a printed circuit board comprising the capacitor. They may be coupled with or embedded within rigid, flexible or in rigid/flexible electrical circuits, printed circuit boards or other microelectronic devices such as chip packages. Generally, they are used by creating a first circuit pattern on one or both electrically conductive material layers. A second circuit pattern may be applied to the polymer surface either in the form of a conductive foil, by electrodeposition, by sputtering, by vapor phase deposition or some other means. In addition, it may be necessary to generate vias in the capacitor to electrically connect opposing circuit layers.

Once a capacitor has been formed, circuit patterns may also be created in the electrically conductive material layer using known etching techniques. In etching, a layer of a photo-imageable resist, dry-film or liquid material is applied to the conductive foil layer. Using a negative photo pattern, which is overlaid on the resist, the photoresist is exposed to actinic radiation such as UV radiation creating a desired circuit pattern. The imaged capacitor is then exposed to film developing chemistry that selectively removes the unwanted unexposed portions. The capacitor with circuit image is then contacted with known chemical etchant baths to remove the exposed conductive layer, leaving the final desired conductive patterned capacitor. Also, each of the conductive material layers may optionally be electrically connected by forming a hole through the entire capacitor and filling it with a conductive metal. Lamination steps are preferably conducted at a minimum of 150° C.

The method of present invention offers a significant improvement in precision and uniformity of the multilayered constructions during assembly. This results in improved performance over prior art capacitors and printed circuit boards, while maximizing cost effectiveness.

The following non-limiting examples serve to illustrate the invention.

Example 1

A 35 μm thick electrodeposited (ED) copper foil is provided, which foil has a surface roughness of 3 microns and has been electroplated with a layer of nickel-phosphorous. The thickness and composition of the nickel-phosphorous layer is such to result in an electrical resistance layer of 25 ohms/square. A layer of epoxy resin is applied to the foil with a thickness of 6 microns. On another 35 μm ED copper foil a layer of epoxy resin is applied to a thickness of 6 microns. The two coated foils are laminated together with a sheet of 12 micron polyamide film between the two resin surfaces. Lamination occurs in a hydraulic press under 250 psi at 350° F. for 1 hour. The press chamber is also under a vacuum of 25 mm Hg. After lamination the combined product is High Potential Tested to 500 volts to check for possible shorts. A pattern is etched into the copper surfaces using industry standard techniques using an alkaline etchant. This chemistry etches the copper without attacking the resistance (Ni—P) layer. A second imaging process is conducted to form the resistor pattern by vacuum laminating a photoresist, exposing and developing it. The photoresist remains on the Ni—P layer that defines the resistor pattern. The background Ni—P is removed using an acid etchant (such as sodium persulfate or sulfuric peroxide). The photoresist is stripped and the circuits are inspected using automated optical inspection and or electrical test (including High Potential testing). The circuitized product goes through a process to prepare the copper for relamination. This process is a black oxide or an alternative. The circuitized product is laminated into a multilayer circuit board and completed using industry standard techniques.

Example 2

Example 1 is repeated except with a resistance layer of 1000 ohms/square, an epoxy resin thickness of 4 microns and polyamide film thickness of 4 microns.

Example 3

Example 1 is repeated except that both sides of the polyamide film are applied with copper foils each having a resistance layer thereon, resulting in a two sided resistor product. The resistances of the layers can be the same or dissimilar such as 25 ohms/square on side one and 1000 ohms/square on side two.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A multilayered construction produced by a process comprising the steps of: attaching a first thermosetting polymer layer onto a surface of a first electrically conductive layer; attaching a second thermosetting polymer layer onto a first surface of a heat resistant film layer; providing a second electrically conductive layer having an electrical resistance material layer formed on a surface thereof; attaching the electrical resistance material layer onto the second thermosetting polymer; and attaching the first thermosetting polymer onto a second surface of the heat resistant film layer;

wherein the electrical resistance material layer is selected from the group consisting of nickel, chrome, nickel-chrome, platinum, palladium, nickel-phosphorus, titanium, iridium, rutherium, silica, and combinations thereof.

2. The multilayered construction of claim 1 wherein the attaching of at least one of the first and second thermosetting polymer layers to opposite surfaces of the heat resistant film layer is by lamination.

3. The multilayered construction of claim 1 wherein the electrical resistance material layer has a resistance ranging from about 0.5 ohms/square to about 10,000 ohms/square.

4. The multilayered construction of claim 1 wherein the first electrically conductive layer and the second electrically conductive layer independently comprise a material selected from the group consisting of copper, zinc, brass, chrome, nickel, aluminum, stainless steel, iron, gold, silver, titanium, platinum and combinations thereof.

5. The multilayered construction of claim 1 wherein the first electrically conductive layer and the second electrically conductive layer comprise copper.

6. The multilayered construction of claim 1 wherein the first electrically conductive layer and the second electrically conductive layer comprise copper foils having a surface roughness Rz in the range of from about 0.5 μm to about 5 μm.

7. The multilayered construction of claim 1 wherein at least one of the first electrically conductive layer and the second electrically conductive layer are provided with a bond enhancing treatment on one or both sides thereof.

8. The multilayered construction of claim 1 wherein at least one of the first electrically conductive layer and the second electrically conductive layer are provided with a bond enhancing treatment which comprises treatment with metal nodules, nickel, chromium, chromates, zinc, a silane coupling agent or combinations thereof.

9. The multilayered construction of claim 1 wherein one or both of the first thermosetting polymer layer and the second thermosetting polymer layer comprise an epoxy, a melamine, an unsaturated polyester, a urethane, alkyd, a bis-maleimide triazine, a polyimide, an ester, an allyated polyphenylene ether or combinations thereof.

10. The multilayered construction of claim 1 wherein the heat resistant film layer comprises a polyethylene terephthalate, a polyethylene naphthalate, a polyvinyl carbazole, a polyphenylene sulfide, an aromatic polyamide, a polyimide, a polyamide-polyimide, a polyether-nitrile, a polyether-etherketone, or combinations thereof.

11. The multilayered construction of claim 1 wherein the electrical resistance material layer comprises nickel-phosphorus.

12. The multilayered construction of claim 11 wherein the electrical resistance material layer contains up to about 30 percent by weight of phosphorus.

13. The multilayered construction of claim 1 wherein the electrical resistance material layer has been formed by electroplating.

14. The multilayered construction of claim 13 wherein said electrical resistance material layer has been formed by electroplating the second electrically conductive layer in a bath comprising an aqueous solution of a nickel ion source, $H_3PO_3$ and $H_3PO_4$, wherein the bath is substantially sulfate and chloride free.

15. The multilayered construction of claim 1 wherein at least the top about ten atomic layers of the electrical resistance material layer are free of sulfur.

16. The multilayered construction of claim 1 wherein the surface of the electrical resistance material layer is substantially pit free and continuous when viewed at a magnification of 400×.

17. The multilayered construction of claim 1 further comprising a barrier layer between said electrical resistance material layer and said second electrically conductive layer, wherein said barrier layer has a thickness of less than about 0.1 μm, is different in composition from said electrical resistance material layer, and is capable of protecting said electrical resistance material layer from attack by alkaline ammoniacal copper etchants.

18. A method of forming a capacitor, comprising the steps of: attaching a first thermosetting polymer layer onto a surface of a first electrically conductive layer; attaching a second thermosetting polymer layer onto a first surface of a heat resistant film layer; providing a second electrically conductive layer having an electrical resistance material layer formed on a surface thereof; attaching the electrical resistance material layer onto the second thermosetting polymer; and attaching the first thermosetting polymer onto a second surface of the heat resistant film layer;
wherein the electrical resistance material layer is selected from the group consisting of nickel, chrome, nickel-chrome, platinum, palladium, nickel-phosphorus, titanium, iridium, rutherium, silica, and combinations thereof.

19. A capacitor produced according to the process of claim 18.

20. A multilayered construction produced by a process comprising the steps of: attaching a first thermosetting polymer layer onto a first surface of a heat resistant film; attaching a second thermosetting polymer layer onto a second surface of the heat resistant film; attaching a first electrically conductive layer onto the first thermosetting polymer; providing a second electrically conductive layer having an electrical resistance material layer formed on a surface thereof; and attaching the electrical resistance material layer onto the second thermosetting polymer;
wherein the electrical resistance material layer is selected from the group consisting of nickel, chrome, nickel-chrome, platinum, palladium, nickel-phosphorus, titanium, iridium, rutherium, silica, and combinations thereof.

21. A multilayered construction produced by a process comprising the steps of: attaching a first thermosetting polymer layer onto a first surface of a heat resistant film layer; attaching a second thermosetting polymer layer onto a second surface of the heat resistant film layer; providing a first electrically conductive layer having a first electrical resistance material layer formed on a surface thereof; providing a second electrically conductive layer having a second electrical resistance material layer formed on a surface thereof; attaching the first electrical resistance material layer onto the first thermosetting polymer layer; and attaching the second electrical resistance material layer onto the second thermosetting polymer layer;
wherein the electrical resistance material layer is selected from the group consisting of nickel, chrome, nickel-chrome, platinum, palladium, nickel-phosphorus, titanium, iridium, rutherium, silica, and combinations thereof.

22. An electronic device comprising a multilayered construction produced by a process comprising the steps of: attaching a first thermosetting polymer layer onto a surface of a first electrically conductive layer; attaching a second thermosetting polymer layer onto a first surface of a heat resistant film layer; providing a second electrically conductive layer having an electrical resistance material layer formed on a surface thereof; attaching the electrical resistance material layer onto the second thermosetting polymer; and attaching the first thermosetting polymer onto a second surface of the heat resistant film layer;
wherein the electrical resistance material layer is selected from the group consisting of nickel, chrome, nickel-chrome, platinum, palladium, nickel-phosphorus, titanium, iridium, ruthenium, silica, and combinations thereof.

* * * * *